United States Patent [19]
He et al.

[11] Patent Number: 6,143,608
[45] Date of Patent: Nov. 7, 2000

[54] BARRIER LAYER DECREASES NITROGEN CONTAMINATION OF PERIPHERAL GATE REGIONS DURING TUNNEL OXIDE NITRIDATION

[75] Inventors: Yue-Song He, San Jose; Masaaki Higashitani, Sunnyvale; Hao Fang, Cupertino; Narbeh Derhacobian, Belmont; Bill Cox, Santa Clara; Kent Chang, Cupertino; Kelwin Ko; Maria Chow-Chan, both of San Jose, all of Calif.

[73] Assignees: Advanced Micro Devices, Inc., Sunnyvale, Calif.; Fujitsu Limited, Kanagawa-ken, Japan

[21] Appl. No.: 09/283,308

[22] Filed: Mar. 31, 1999

[51] Int. Cl.$^7$ ................................. H01L 21/336
[52] U.S. Cl. ................... 438/264; 438/287; 438/770; 438/786; 438/791
[58] Field of Search .................. 438/201, 211, 438/216, 217, 257, 261, 263, 264, 287, 770, 786, 787, 785, 791; 257/324, 410, 411

[56] References Cited

U.S. PATENT DOCUMENTS

| | | | |
|---|---|---|---|
| 5,466,622 | 11/1995 | Cappelletti | 438/438 |
| 5,506,159 | 4/1996 | Enomoto | 438/258 |
| 5,541,129 | 7/1996 | Tsunoda | 438/264 |
| 5,553,017 | 9/1996 | Ghezzi et al. | 365/185.01 |
| 5,792,696 | 8/1998 | Kim et al. | 438/258 |
| 5,889,305 | 3/1999 | Choi et al. | 257/324 |
| 6,025,228 | 2/2000 | Ibok et al. | 438/261 |

*Primary Examiner*—T. N. Quach
*Attorney, Agent, or Firm*—Fliesler, Dubb, Meyer & Lovejoy, LLP

[57] ABSTRACT

This invention describes methods for producing gate oxide regions in periphery regions of semiconductor chips, wherein the gate oxide regions have improved electrical properties. The methods involve the deposition of a barrier layer over the periphery of the semiconductor chip to prevent the introduction of contaminating nitrogen atoms into the periphery during a nitridation step in the core region of the semiconductor chip. By preventing the contamination of the gate areas of the periphery, the gate oxide regions so produced have increased breakdown voltages and increased reliability. This invention describes methods for etching the barrier layers used to protect the periphery from tunnel oxide nitridation. Semiconductor devices made with the methods of this invention have longer expected lifetimes and can be manufactured with higher device density.

24 Claims, 5 Drawing Sheets

BARRIER LAYER DECREASES NITROGEN CONTAMINATION OF PERIPHERAL GATE REGIONS DURING TUNNEL OXIDE NITRIDATION

FIELD OF THE INVENTION

This invention relates to the manufacture of semiconductors and to methods of manufacturing non-volatile memory devices for semiconductors. Specifically, this invention relates to methods for fabricating a flash EPROM or EEPROM memory device. More specifically, this invention relates to providing protection of a peripheral gate region by providing a layer of nitride before manufacturing tunnel oxide by a nitridation process.

BACKGROUND OF THE INVENTION

I. Non-Volatile Memory Devices

Non-volatile memory devices, and particularly so-called "flash" memory devices have become increasingly popular in data storage applications. The term EPROM is an acronym for Erasable Programmable Read Only Memory, while EEPROM refers to Electrically Erasable Programmable Read Only Memory. The term "flash" in conjunction with electrical erasable programmable read only memory or "Flash EEPROMS", generally refers to EEPROM memory cells which are programmed by hot electron injection and erased by Fowler-Nordheim tunneling. The operation and structure of one type of such devices, namely NOR devices, is discussed in U.S. Pat. No. 4,698,787, issued Oct. 6, 1987, to Mukherjee et al., and Samachisa et al., "A 128K Flash EEPROM Using Double Polysilicon Technology," *IEEE Journal of Solid State Circuits*, 22(5):676–683 (October 1987), both references herein incorporated fully by reference. The operation and structure of another type of such devices, namely NAND devices, is discussed in Suh et al., A 3.3 V 32 Mb NAND Flash Memory with Incremental Step Pulse Programming Scheme, *IEEE Journal of Solid-State Circuits* 30(11):1149–1155 (November 1995), herein incorporated fully by reference.

Generally, an array of flash EPROM or EEPROM memory cells can be formed on a semiconductor substrate in a series of rows and columns, accessed by conductors referred to as word lines and bit lines, respectively. FIG. 1 depicts the relationship between different regions of a semiconductor chip 10. Memory cells can be arranged typically in a common region, referred to as the "core" area 121 of chip 10. Other devices necessary for the operation of the device, such as the peripheral transistors and amplifiers, can be located in the "periphery" region 120 of chip 10. In the core region, all memory cells or other devices can have essentially the same dimensions, allowing simultaneous fabrication of the cells in the core region using common processing steps.

Each memory cell is formed in a semiconductor substrate, by way of example only, by the diffusion into what will become an n+ source region and an n+ drain region, of an n type dopant, such as by way of example only, phosphorous or arsenic. A channel region can be positioned between the drain and source regions. The channel region between the source and drain regions is the location where the memory cell "gate stack" or "gate" is to be located. The channel region can be typically doped with a p-type dopant, by way of example only, boron. This doping step is termed an "implantation step." Typically, prior to the manufacture of the gate stack, a layer of tunnel oxide can be formed on the silicon substrate of the channel region after the implantation step. By way of example only, such tunnel oxide can be manufactured by reacting the silicon substrate at elevated temperatures in the presence of $O_2$ and $N_2O$ or NO. This process, termed "nitridation" enhances interface bonding states between silicon dioxide and the silicon substrate, thereby improving the reliability of tunnel oxide. After the creation of the tunnel oxide layer, typically a layer of conductive material such as polysilicon can be deposited on the top of the tunnel oxide layer, resulting in the formation of a "floating gate." Subsequently, a dielectric layer can be formed over the polysilicon layer, and another layer of polysilicon or other conductive material can be deposited over the dielectric layer, forming a "control gate." The control gate is connected to a source of electrical charge, and the entire structure consisting of the sandwich of polysilicon layers separated by a dielectric layer is termed the "control gate stack."

The application of voltage to the control gate can induce a charge in the floating gate. If there is a net positive charge in the floating gate, there can be an induced change in the channel region between the source and drain regions, and electrons can flow from the source region to the drain regions of the device, and the device is considered to be "on." The creation of charge in the floating gate is termed "programming" of the floating gate of the memory cell.

Programming and erasing of these structures is achieved by creating potential differences between the gate and the channel or drain lines. The thin tunnel oxide region coupled with the high voltage difference between gate and drain can permit a phenomenon called "Fowler-Nordheim tunneling" to take place. Programming the floating gate involves placing electrons on the gate. To program an EPROM or an EEPROM cell, a hot injection mechanism can be typically used.

Typically, for NAND type architecture, all cells are in series. In the read mode, selected word lines have 0 V placed on the control gate, and a voltage of about 4.5 V is applied to unselected word lines. The magnitude of the current resulting from application of the read voltage, the "read current" can be used to determine whether the flash EPROM or EEPROM cell is programmed or not. If the application of the read voltage results in current flow, then the memory cell is in the un-programmed state. However, if application of the read voltage does not result in a read current, the memory cell is in the programmed state.

For most memory storage applications, it is desirable for the floating gates to retain the charge applied to them for long periods of time. However, with conventional non-volatile memory devices, the erase charge in the memory cell can be lost. With the loss of the erase charge, the floating gate can become unintentionally programmed, which can lead to product failure. Nitridation of tunnel oxide layers can reduce unintentional programming or de-programming by reducing either unintentional charge loss or charge gain. However, the current methods for carrying out tunnel oxide nitridation can have the unintended effect of causing electrical reliability problems in the devices fabricated on the periphery regions of the semiconductor wafer. These problems can arise from contamination of silicon regions where gate oxide layers are to be formed by nitrogen introduced during nitridation.

II. Manufacture of Non-Volatile Memory Devices

The manufacture of semiconductor memory devices begins with a wafer of silicon on which all of the devices are to be manufactured. The first step involves the creation of isolation regions which serve to electrically isolate the active regions from each other, followed by manufacture of active regions, containing sources, drains, and gate stacks. Electrical isolation may be via the formation of Shallow Trench Isolation ("STI") wherein grooves are etched in the silicon wafer and are filled with insulating materials termed "dielectric" materials. Alternatively, the Local Oxidation Of Silicon ("LOCOS") process can be used, wherein areas of insulating materials are formed on the surface of the wafer to provide electrical isolation of active regions. Therefore, to minimize the size of semiconductor devices, one aim of manufacturers is to make the isolation regions narrow. Narrower isolation regions can permit the manufacture of semiconductor integrated circuits having higher device densities, which can lead to increased performance and decreased manufacturing cost A. Local Oxidation of Silicon (LOCOS)

In the LOCOS process, the isolation regions on the wafer can be made by oxidation product of silicon to produce silicon dioxide. When sufficiently thick, silicon dioxide can be an effective insulator, preventing unwanted electrical interaction between nearby devices. To manufacture isolation regions using the LOCOS process, the wafer surface can be first covered with a layer of nitride, such as silicon nitride ($Si_3N_4$). The silicon nitride can inhibit the diffusion of oxygen into the underlying silicon wafer, thereby preventing the undesired oxidation of the silicon layer where active devices are to be manufacture. In those areas of the wafer where isolation regions are to be created, the silicon nitride layer can be selectively removed, or "etched," exposing the underlaying silicon surface. Subsequently, the exposed areas of silicon can be oxidized, typically by heating the wafer in a furnace containing an oxidizing agent such as oxygen or ozone. When masked with the nitride layer, exposure of the wafer to oxidizing conditions ideally can result in formation of $SiO_2$ only on the surfaces of those portions of the wafer which are not covered by the nitride layer. Thus, local areas of oxide, termed "field oxide" can be formed, and can become the insulators which isolate semiconductor devices from one another on the wafer. $SiO_2$ is less dense than silicon, so the formation of field oxide regions results in the appearance of a thickening of the wafer surface at those locations.

However, when oxidation is carried out as described, heating the wafer can result in thermal expansion of both the silicon and nitride layers. Because nitride and silicon have different coefficients of thermal expansion, the heating can result in differential expansion of the two materials. This can lead to de-lamination of the nitride layer, causing undesired oxidation of the silicon under the edges of the nitride layer, and can result in the spreading of the field oxide region under the nitride layer, forming what are termed "birds beaks." The formation of birds beaks effectively can decrease the area available for active regions of the semiconductor devices, and can defeat one of the purposes of using the LOCOS process, namely the increase in device density on a semiconductor wafer. As further oxidation occurs, the delamination also can increase, and thus, the sizes of the birds beaks can increase, further diminishing the size for formation of active regions on the wafer.

One way of diminishing the size of birds beaks is to apply a thin layer of oxide ("pad oxide") over the silicon wafer before deposition of the nitride layer. Pad oxide has a coefficient of thermal expansion similar to that of the nitride masking material, so subsequent exposure of the wafer to high temperatures does not necessarily delaminate the nitride layer as much as is the case with nitride on unoxidized silicon.

B. Formation of Active Regions and ONO Layers

After the formation of field oxide regions, active regions are manufactured. First, the nitride layer is etched away to expose the underlying silicon dioxide. Typically, the wafer is then exposed to a nitridation step, wherein a relatively thin layer of tunnel oxide ($SiO_2$) about 90 Å thick is nitrided by exposure to $N_2O$ or NO and annealed. The resulting nitrided tunnel oxide layer is about 95 Å in thickness. The resulting structure is shown in FIG. 2. FIG. 2 shows a typical section of a semiconductor wafer 200 having a periphery region 120 and a core region 121 made using the above steps. Silicon substrate 104 has regions of field oxide 108 deposited thereon, with areas of nitrided tunnel oxide 112 therebetween. This function of this thin layer of tunnel oxide is to promote the movement of charge from the source, drain, or silicon substrate to the floating gate.

After the nitridation step, a layer of a polysilicon is deposited over the entire wafer. The polysilicon layer can be subsequently etched to form floating gate regions ("poly 1"), which will function to store charge in the device after programming. After etching of the polysilicon layer, sequential deposition and etching of layers of $SiO_2$, nitride, and $SiO_2$ (the "ONO" step) provide a total thickness of the ONO layer of about 150 Å.

C. Formation of Periphery Devices

After ONO deposition, devices in the periphery of the semiconductor chip are then manufactured. The entire wafer can then be covered with photoresist. An ONO mask is placed over the core region, leaving the periphery uncovered. Exposure of the photoresist to electromagnetic radiation, followed by developing the photoresist layer reveals the underlying periphery circuit region. Then the ONO layer and poly 1 layer are etched in the periphery, followed by HF treatment to remove the oxide layer in areas where active devices are to be manufactured. Then the layer of photoresist can be removed by a cleaning step. The silicon layer is then carefully oxidized to grow a region of "gate oxide" about 150 Å in thickness for the subsequent manufacture of active periphery devices.

After the gate oxide is formed on the silicon at the periphery region, a layer of polysilicon ("poly 2") can be deposited over the entire wafer. In the core region, this poly 2 layer can become the control gate of the memory cell. In the periphery, the poly 2 layer can be deposited directly over the gate oxide regions, and subsequently, as desired for the particular device to be manufactured, layers of silicide, typically tungsten silicide, and silicon oxynitride can be deposited and etched to form the devices in the periphery region of the chip.

Subsequent processing steps can include formation of contacts, contact etching, metal deposition, metal etching, passivation layer deposition, and pad formation. These steps are known in the art and are not described herein further. The resulting periphery devices can then be connected to the core devices to complete the manufacture of the integrated circuit.

Problems with the above described methods of manufacturing gate oxide layers in the periphery in this fashion can result from the nitridation step of the core region. Nitridation can result in the contamination by nitrogen atoms of the silicon substrate region in the periphery regions where the gate oxide and active regions are to be manufactured. The presence of nitrogen in the silicon layer can cause the gate oxide layer to grow more slowly than in areas where there is no nitrogen contamination. The localization and degree of nitrogen contamination can be unpredictable, and as a result, gate oxide layers in the periphery can be formed having uneven thickness and density. The un-evenness can result in non-uniformity of electrical properties of the gate oxide. In areas with little or no nitrogen contamination, the gate oxide layer can be about 150 Å in thickness, which provides a breakdown voltage of about 15 V. However, in areas which are contaminated by nitrogen, the thickness of the gate oxide can be as low as about 50 Å, which provides a breakdown voltage of about 10 V or less, and can even be as low as 2–3 V. Thus, different parts of the gate oxide region can have different breakdown voltages, and because the overall breakdown voltage of a gate can be determined by the lowest breakdown value of the oxide present in that gate, the gate as a whole can exhibit a reduced breakdown voltage, which can lead to failure of devices in the periphery region. Therefore, the conventional methods are incapable of producing reproducible gate oxide layers in peripheral regions having high breakdown voltages, while permitting the nitridation of tunnel oxide, which is desirable for the manufacture of non-volatile memory cells.

Therefore, one object of this invention is the development of methods to manufacture gate oxide layers with improved uniformity and higher, more predictable electrical breakdown voltage.

Another object of this invention is the development of methods for manufacturing periphery gate oxide layers having reduced nitrogen contents.

Another object of this invention is the manufacture of semiconductor devices having improved gate oxide uniformity and higher, more predictable electrical breakdown voltage.

Yet another object of this invention is the manufacture of semiconductor devices having gate oxide regions with reduced nitrogen contents.

SUMMARY OF THE INVENTION

Thus, this invention comprises manufacturing methods for the deposition of a thin layer of a barrier material ("barrier layer") over the semiconductor surface to prevent contamination of nearby regions of the semiconductor wafer by nitrogen atoms during the nitridation. The barrier layer therefore protects regions where gate oxide is to be formed during subsequent processing steps from contamination with nitrogen. Thus, in core regions where tunnel oxide is to be grown and nitridated, the protective barrier layer is etched away, exposing the silicon substrate. Oxidation and nitridation of the core regions can be carried out, thereby providing the desired tunnel oxide composition, while leaving intact the barrier layer covering periphery areas, thereby preventing contamination of the areas where gate oxide is to be formed. Subsequent removal of the barrier layer at the periphery exposes the silicon oxide regions which are uncontaminated by nitrogen. Gate oxide can be formed with greater uniformity on uncontaminated areas than on areas which are contaminated, thus producing more uniform gate oxide layers. The greater uniformity of the gate oxide layers results in improved electrical properties of devices manufactured in the periphery.

Thus, in one aspect of the invention, the barrier layer is a layer of nitride is deposited using chemical vapor deposition (CVD).

Another aspect of the invention involves the use of silicon oxynitride as a barrier layer.

A further aspect of the invention involves the use of polysilicon as a barrier layer.

In a further aspect of the invention, the nitride barrier layer is between about 50 Å and about 400 Å in thickness.

Another aspect of this invention is the development of improved methods for selectively removing nitride and oxynitride layers, while sparing oxide layers.

In another aspect of the invention, semiconductor devices are manufactured which have gate oxide regions with greater uniformity and increased electrical breakdown voltages.

BRIEF DESCRIPTION OF THE FIGURES

The invention will be described with respect to the particular embodiments thereof, Other objects, features, and advantages of the invention will become apparent with reference to the specification and drawings in which.

DETAILED DESCRIPTION OF THE INVENTION

Figure 1:
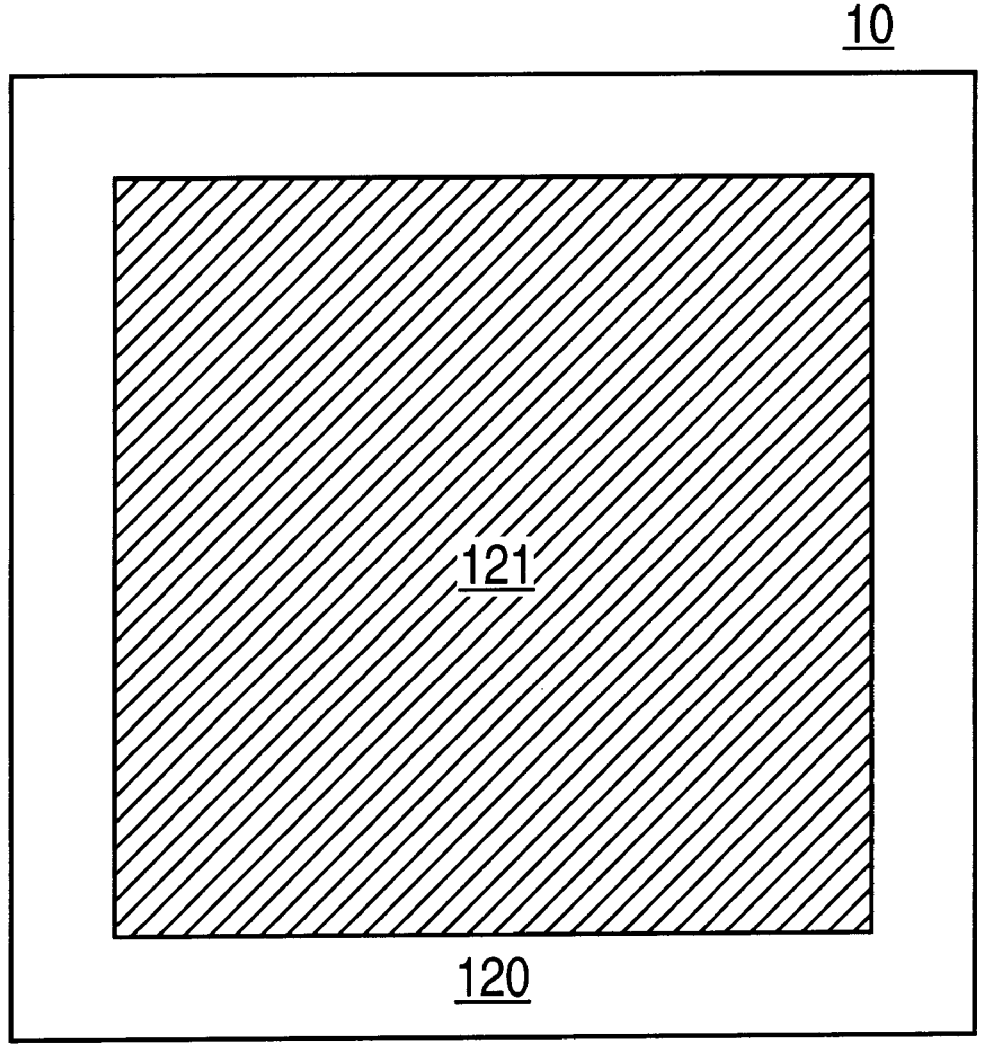
FIG. 1 is a drawing showing a portion of a semiconductor wafer having core and periphery regions.
Figure 2:
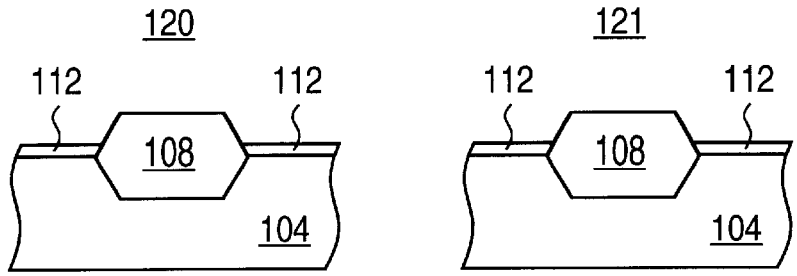
FIG. 2 is a drawing of a prior art semiconductor device showing periphery and core areas having regions of sacrificial oxide bounding areas of field oxide.

I. Deposition of a Barrier Layer to Protect Gate Oxide

To overcome the problems of the conventional methods of manufacturing gate oxide regions, namely the introduction of contaminating nitrogen into the silicon layers during tunnel oxide nitridation, a barrier layer is deposited over the periphery prior to tunnel oxide nitridation in the core region. The barrier layer can be, by way of example only, a nitride, polysilicon, and/or an oxynitride. The thickness of the barrier layer needed depends on the type of protective material used. In general, the protective layer should be sufficiently thick to prevent the migration of nitrogen through the protective layer and contaminating the underlying silicon substrate.

For example, the barrier layer can be a nitride, including but not limited to silicon nitride ($Si_3N_4$). The nitride layer can be from about 50 Å to about 400 Å thick, alternatively, from about 100 Å to about 300 Å thick, and in another embodiment, about 200 Å thick, and in yet another embodiment, about 180 Å thick. The layer of nitride can be deposited using any convenient means, by way of example only, chemical vapor deposition (CVD). One type of CVD, plasma enhanced CVD (PECVD) can be used to deposit silicon nitride from the precursors silane ($SiH_4$) and ammonia ($NH_3$). Typically, the precursors are introduced into the CVD chamber, where a source of plasma energy dissociates the precursors into reactive intermediates. The reactive intermediates combine on the semiconductor surface to form the layer of nitride. The energy used is typically a radiofrequency (RF) plasma having a power in the range of power of about 1 Watt/$cm^2$ wafer surface area to about 3 Watts/$cm^2$. The pressure in the chamber can be in the range of about 1 Torr to about 100 Torr. The deposition rate can be adjusted by regulating at least one of several deposition conditions. Regulating the flow rates of the precursors into the deposition chamber is one convenient means of adjusting deposition rate. By way of example, the flow rates for silane and ammonia can be in the range of about 100 standard cubic centimeters per second (sccm) to about 500 sccm. The deposition of other nitride layers can be carried out using similar methods and different precursors known in the art.

Alternatively, the barrier layer can be a polysilicon layer deposited by PECVD or other conventional means. The manufacture of a polysilicon layer by PECVD follows similar processes as the manufacture of silicon nitride, except for the omission of ammonia in the deposition chamber. Thus, upon exposure to RF plasma, silicon reactive intermediates are generated, and the resulting deposited film is comprised of polysilicon. A layer of polysilicon is advantageously in the range of about 500 Å in thickness to about 1200 Å, alternatively about 900 Å in thickness.

In another embodiment of the invention, the barrier layer can be a layer of oxynitride, which can be manufactured using PECVD methods in which $SiH_4$, $NH_3$, $O_2$ or $O_3$, and either $N_2O$ or NO are injected into the deposition apparatus. The flow rates of silane and ammonia can be similar to those used for the manufacture of nitride layers, with the addition of $N_2O$ or NO, delivered at a flow rate in the range of about 40 sccm to about 150 sccm. The thickness of the oxynitride barrier layer can be in the range of abut 400 Å to about 500 Å. After deposition, the film can be annealed to produce a film of oxynitride having a high concentration of nitrogen at the interface between the Si substrate and the oxide layer.

After its formation, the barrier layer can be etched to expose the underlying silicon oxide surface. The etching means used can be either a conventional nitride or polysilicon etching method or a new method more suited for careful etching of the thin layers of this invention. Thereafter, the nitridation step can proceed to produce nitridated tunnel oxide, which provides beneficial properties to the memory cells of which the tunnel oxide is a part.

II. Etching of the Barrier Layer

After the nitridation step and the manufacture of core devices, the barrier layer can be removed from the periphery using selective nitride etching methods. To remove polysilicon barrier layers, conventional poly etch methods using, by way of example only, a mixture of chlorine, hydrogen bromide (HBr), helium and oxygen can be used. These methods are well known in the art and are not discussed further. To etch the oxynitride type of barrier layers, a conventional oxynitride etch process can be carried out. To remove the nitride type of barrier layers, either a conventional etch process or a new process can be used.

Nitride etching processes suitable to remove the nitride layers of this invention involve the introduction of etchant gases into the process chamber. Conventional gas etching methods use $CH_3F$ and $O_2$, which are introduced simultaneously into an etching chamber at flow rates of 40 standard cubic centimeters per min (sccm) each, with a total pressure in the chamber of 40 milliTorr (mTorr) and a radiofrequency (RF) power of 400 Watts (W) for a wafer having a diameter of 8 inches. This method results in an etch rate of nitride of about 1100 Å, with a nitride:oxide selectivity of about 5.

It can be desirable to use a more selective, slower etching process, especially for nitride layers that are thinner than the conventional layers. A new nitride etch process of this invention involves the introduction of a mixture of three gases into the process chamber. In general, the mixture comprises a halogen, an oxidant, and an acid halide. The halogens include, by way of example only, $Cl_2$, $Br_2$, and $I_2$. The oxidant can be $O_2$ or He $O_2$ mixtures. The acid halide component can be HCl, HBr, or HI. While in the chamber, a source of power, for example RF power dissociates the etchant gases, thereby providing reactive intermediate moieties that are responsible for removing the silicon and nitrogen from the nitride layer. This method can be performed in the same chamber as the other semiconductor manufacturing steps described above.

The rate of etching of the nitride layer of this invention depends on the composition of the etchant gas, the total flow rate of etchant gases into the chamber, the pressure within the chamber, the RF power used, and the time of exposure to etching conditions. It can be desirable to etch nitride layers of this invention at rates lower than provided for by conventional methods. By way of example, etching rates can be in the range of about 100 Å/min to about 600 Å/min, alternatively about 200 Å/min. to about 400 Å/min, and in another embodiment, about 400 Å/min.

It can also be desirable to provide an etching method which has a high degree of selectivity of nitride or oxynitride to oxide. Conventional methods that provide a nitride:oxide selectivity of about 5 are not ideally suited for etching thin barrier layers, because those methods can etch away the underlying oxide regions. Thus, it is desirable to provide nitride:oxide selectivity of greater than about 5. The selection of etching process variables can be made by reference to the following Table 1. In Table 1, gas flow rate is the flow of all etchant gases together, the H:O ratio is the ratio of halogen to oxidant, and the A:O ratio is the ratio of acid halide to oxidant.

TABLE 1

Process Variables for Nitride/Oxynitride: Oxide Etching

| Total Pressure (milliTorr) | Gas Flow Rate (sccm) | H:O Ratio | A:O Ratio | Time | RF Power (Watts/$cm^2$) |
|---|---|---|---|---|---|
| 50–150 | 30–250 sccm | 3–12 | 5–20 | 5 sec– 2 min | 0.5–3 |

Using process variables selected from Table 1, etching rates for nitride can be in the range of about 100 Å/min to about 600 Å/min. Etching rate is increased by increasing total pressure, total gas flow rate, etching time, and RF power. Nitride etch rate is also increased by increasing the halogen and acid halide ratios relative to oxidant. The selectivity of nitride:oxide etching can be in the range of from about 5 to about 15. Thus, to etch relatively thin nitride layers, one can select total pressure, gas flow rate, time, and RF power near the lower portion of the ranges. By way of example, to produce a low-halogen, weakly etchant mixture having a ratio of H:O:A of 3:1:20, the flow rates of halogen, oxidant and acid halide can be 3.75, 1.25, and 25 sccm respectively. Conversely, to etch thicker nitride layers, it can be desirable to select values in the upper ranges of those listed in Table 1. By way of example only, to produce a high-halogen, strongly etching mixture having a ratio of H:O:A of 12:1:5, the flow rates of halogen, oxidant and acid halide can be 167, 14 and 69 sccm, respectively.

A theory that may account for the beneficial effects of the etching method of this invention is that nitride can be reacted with etchant gases to generate volatile degradation products. By way of example only, silicon atoms in the silicon nitride layer can react with $Cl_2$, $Br_2$ or $I_2$ to form $SiCl_4$, $SiBr_4$ or $SiI_4$, respectively. These species are volatile at the temperatures and pressures of typically used etching apparatus. Additionally, nitrogen atoms can be oxidized by the oxygen in the etchant gas mixture to form $NO_2$, which is also volatile. Thus, the atomic components of the nitride layer can be removed from the surface, and the reaction products can be removed by exhaustion of the the reaction chamber. However, this invention does not rely upon any particular theory for operability and other theories can account for the observations.

Example 1

A mixture of $Cl_2$, $O_2$, and HBr was used to etch a nitride layer on oxide according to process conditions shown in Table 1. The results of this study are presented in Table 2.

TABLE 2

Nitride Etching Using A Three-Gas Mixture

| $Cl_2$ Flow (sccm) | $O_2$ Flow (sccm) | HBr Flow (sccm) | RF Power (W/cm$^2$) | Etch Rate (Å/min) | Nitride:Oxide Selectivity |
| --- | --- | --- | --- | --- | --- |
| 62 | 5 | 88 | 1.61 | 392 | 7.5:1 |

According to the results shown in Table 2, the etch method of this invention provided a lower etch rate and produced an unexpectedly higher nitride:oxide selectivity than conventional etching methods. Thus, the etching process of this invention can provide closer control over the etching of relatively thin layers of nitride of this invention. If the etching rate is too fast, as can be the case with the conventional etching process described above, it is difficult to control the uniformity of the resultant surface, and it is difficult to leave the oxide layer un-etched. Furthermore, greater nitride:oxide selectivity means that less of the underlying oxide layer will be etched as the nitride layer is removed.

Similarly, using the etching method of this invention, silicon oxynitride layers can be effectively etched. However, oxynitride layers can be thicker than nitride layers having the equivalent efficacy as barrier layers. Therefore, conventional etch methods are also suitable for removing oxynitride layers. Moreover, etching of polysilicon barrier layers can be carried out using the methods of this invention. However, the etch rates are slower than for nitride and oxynitride. Furthermore, because polysilicon barrier layers can be thicker than nitride or oxynitride layers, the required etching processes can be more time-consuming than those for nitride etching. Because polysilicon barrier layers are thicker than nitride layers, and because polysilicon etch rates are slower, it can be desirable to etch polysilicon barrier layers using process conditions that provide faster etching. Thus, the RF power, etching time and gas flow rate can be selected from the upper portion of the values shown in Table 1.

III. Manufacture of Source and Drain Regions with Gate Oxide Having Low Nitrogen Content A. Formation of Field Oxide Regions To manufacture a semiconductor device in the periphery using the methods of this invention, a semiconductor substrate of silicon can be oxidized to form a layer of sacrificial oxide using thermal oxidation in the presence of $O_2$ or $O_3$. The layer of sacrificial oxide can have a thickness of about 250 Å. After the nitride etch step, the exposed areas of silicon can be oxidized in an atmosphere of oxygen at temperatures of about 950° C. to about 1050° C. to form a layer of field oxide. The field oxide can be grown to a thickness of about 2500 Å to provide electrical isolation of active device regions. However, the thickness of the field oxide region can be adjusted to meet the needs of different applications. The nitride and sacrificial oxide layers can then be removed, exposing regions of silicon, which are the areas where active source and drain regions can be formed.

In another alternative method, a layer of photoresist ("PHOTORESIST") can be deposited on top of the nitride layer, and then mask layers can be formed over the top of the PHOTORESIST layer. Subsequent etching of the PHOTORESIST layer down to the nitride layer, followed by reactive ion etching ("RIE") and removal of the mask layer can result in areas of photoresist on top of the nitride layer. Dry etching to remove the nitride in areas not covered by photoresist and subsequent cleaning to remove the PHOTORESIST can result in localized areas of nitride on the pad oxide layer. Wet etching or RIE can thereafter be used to remove the sacrificial oxide layer. Subsequently, the wafer can be exposed to oxidation to form areas of field oxide.

B. Formation of Low Nitrogen Gate Oxide Regions Using a Barrier Layer

Figure 3:
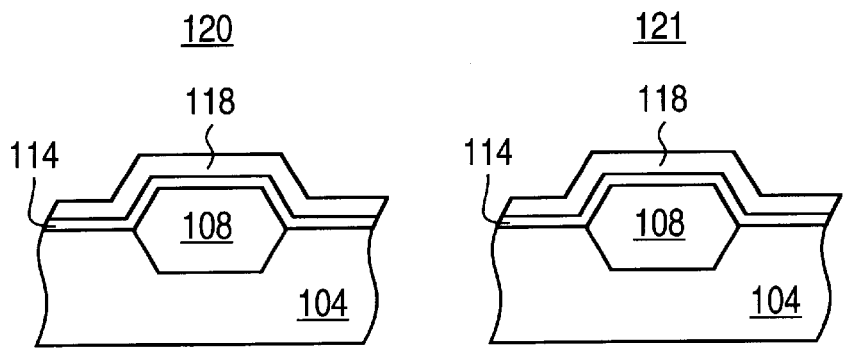
FIG. 3 is a drawing of periphery and core areas of a semiconductor chip of this invention after the deposition of a layer of nitride over the entire wafer surface.

A process of the invention for manufacturing low nitrogen gate oxide regions is exemplified by the following description of an embodiment in which the barrier layer is a nitride layer. In the descriptions that follow, like numbers in the figures refer to identical elements. FIG. 3 is a drawing of a portion of a semiconductor wafer 200 having a periphery region 120 and a core region 121. Each of periphery region 120 and core region 12 comprise a silicon substrate 104. Areas of field oxide 108 are formed on silicon substrate 104, and subsequently, wafer 200 can be exposed to an oxidizing environment to manufacture a layer of oxide 114, termed "sacrificial oxide" on silicon substrate 104. Subsequently, a layer of nitride 118 is deposited on top of the sacrificial oxide layer 114. The layer of nitride 118 can provide protection of the underlying areas of silicon from contamination by subsequent tunnel oxide nitridation.

Figure 4:
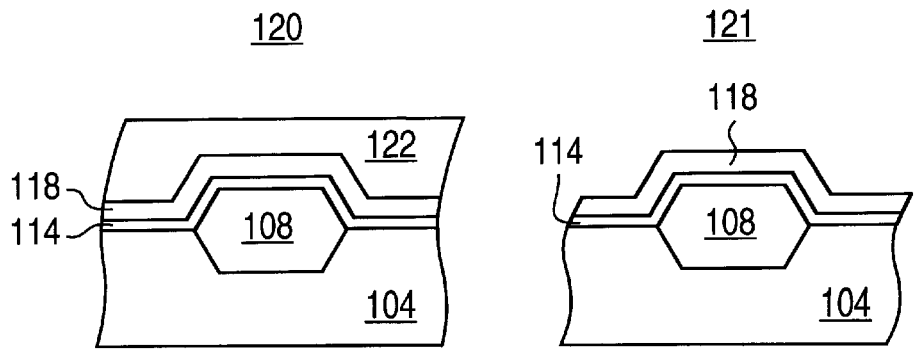
FIG. 4 is a drawing of the semiconductor device of FIG. 3, with a subsequent core mask of photoresist material deposited over the periphery.
Figure 5:
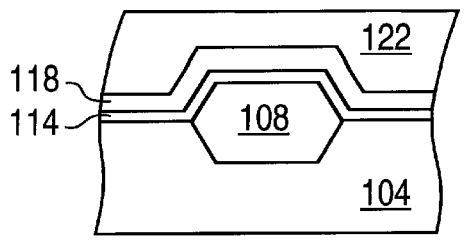
FIG. 5 is a drawing of the portion of the semiconductor wafer shown in FIGS. 3 to 4, but after etching the nitride layer and subsequent doping with boron.
Figure 5:
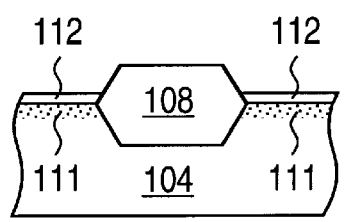

FIG. 4 is a drawing of the same portion of the semiconductor wafer 200 shown in FIG. 3. The silicon substrate 104, the field oxide regions 108, sacrificial oxide layer 114 and nitride layer 118 are as in FIG. 3. Photoresist layer 122 can be deposited over the nitride layer 118 in the periphery 120 of the wafer. The core region 121 can have no photoresist deposited on it, and is the area where core devices are to be manufactured. In FIG. 5, the core region 121 has been etched to remove the the nitride layer 118 and the sacrificial oxide layer 114, thereby exposing the underlying silicon substrate 104. Subsequently, the exposed portion of the silicon substrate 104 can be doped with about $3 \times 10^{12}$ boron atoms/cm$^2$, implanted at about 60 keV into the core region 121 as a core $V_t$ adjustment implant region 111 according to methods known in the art. After formation of core implant region 111, the wafer can be cleaned to remove photoresist layer 122 over the periphery 120, and a layer of tunnel oxide 112 can be made by a nitridation step using N$_2$O or NO according to methods known in the art.

Figure 6:
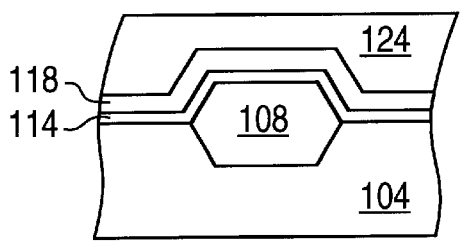
FIG. 6 is a drawing of the same portion of the semiconductor wafer shown in FIGS. 3–5 but after creation of a tunnel oxide layer in core regions and deposition of a poly-1 layer.
Figure 6:
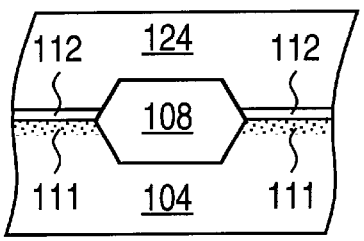

FIG. 6 is a drawing of the same semiconductor wafer as shown in FIGS. 3–5 wherein a layer of polysilicon 124 has been deposited over the entire wafer.

Figure 7:
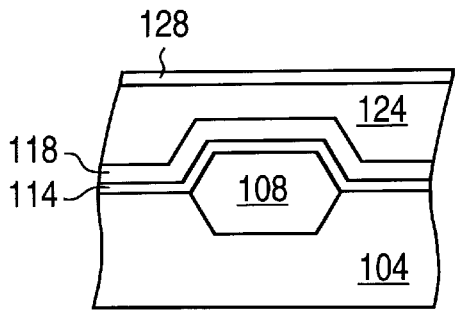
FIG. 7 is a drawing of the same semiconductor wafer as shown in FIGS. 3–6, but after etching and cleaning the poly-1 layer in the core, and after deposition of an ONO layer over the entire wafer.
Figure 7:
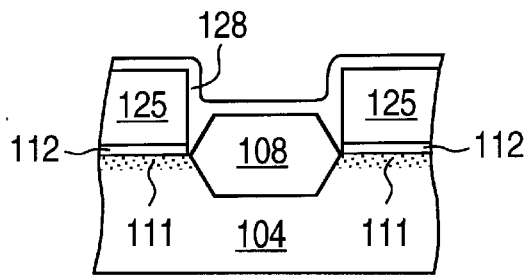
Figure 8:
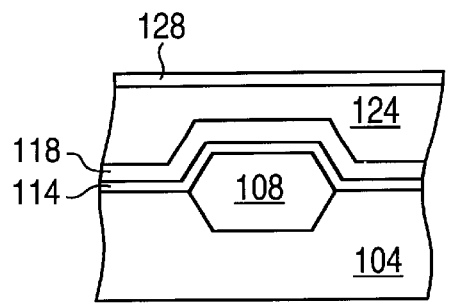
FIG. 8 is a drawing of the same semiconductor wafer as shown in FIGS. 3–7, but after deposition of an oxynitride mask layer over the core region of the wafer.
Figure 8:
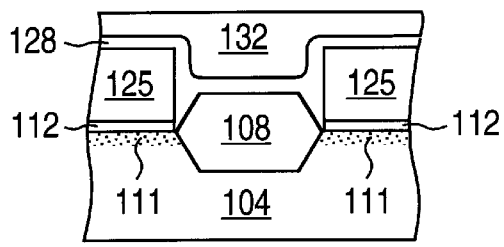

FIG. 7 is a drawing of the same semiconductor wafer as shown in FIGS. 3–6. The polysilicon layer 124 has been masked over the core region 121, the polysilicon layer 124 has been etched to form poly 1 gates 125, and an ONO layer 128 comprising sequential layers of SiO$_2$, nitride and SiO$_2$, for a total of about 150 Å thickness, has been deposited over the entire semiconductor wafer. FIG. 8 is a drawing of the same semiconductor wafer as shown in FIGS. 3–7. An ONO mask layer 132 has been applied over the core region 121.

Figure 9:
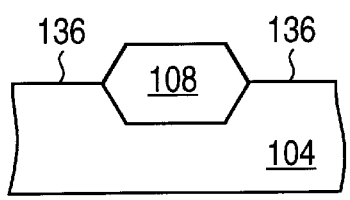
FIG. 9 is a drawing of the same semiconductor wafer as shown in FIGS. 3–8, but after ONO etch, poly-1 etch, nitride etch and sacrificial oxide etch steps in the periphery, revealing the underlying layer of silicon.
Figure 9:
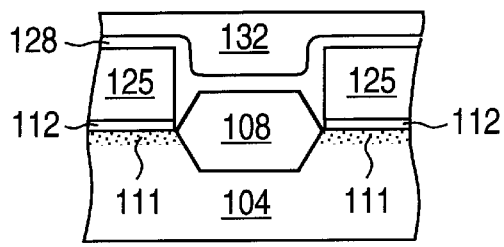

In FIG. 9, at the periphery 120, the ONO layer 128, the polysilicon layer ("poly-1") 124, the nitride layer 118 and the sacrificial oxide layer 114 have been removed, exposing the underlaying surface 136 of silicon substrate 104. By virtue of the protection to the periphery 120 during the processing of the core region 121, the surface 136 of silicon substrate 104 now exposed is substantially free of nitrogen atoms.

Figure 10:
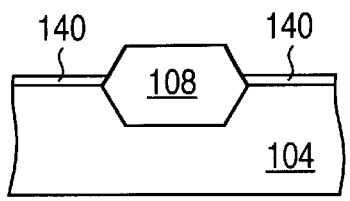
FIG. 10 is a drawing of the same semiconductor wafer as shown in FIGS. 3–9, but after growth of a gate oxide layer on the periphery of the wafer.
Figure 10:
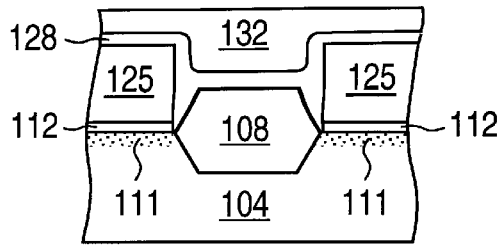

FIG. 10 is a drawing of the same semiconductor wafer as shown in FIGS. 3–9. A new layer of gate oxide 140 has been grown over the silicon substrate 104 in the periphery 120.

Figure 11A:
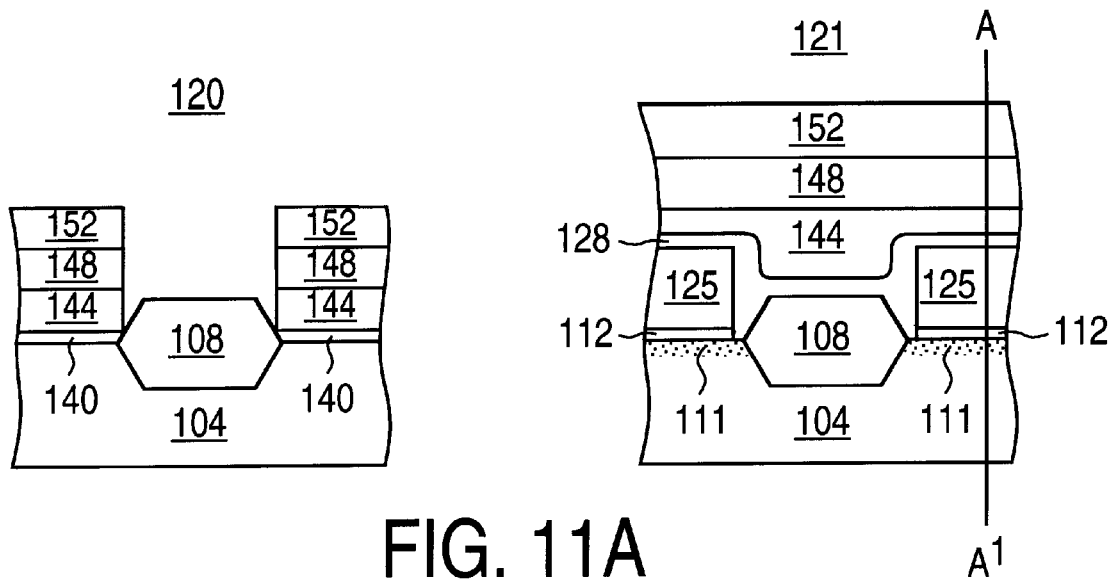
FIG. 11A is a drawing of a semiconductor wafer having periphery and core regions having gate stacks.
Figure 11B:
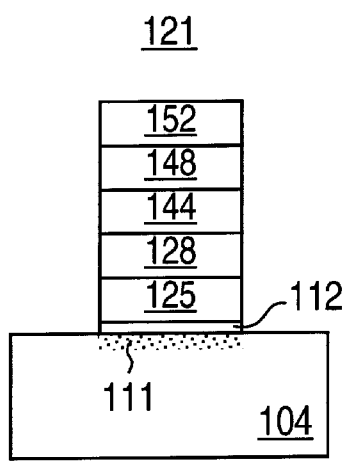
FIG. 11B is a side view of the gate stack depicted in the core region of FIG. 11a along the axis defined by the line a—a'.

FIG. 11A is a drawing of a completed series of gate stacks. On periphery 120, a polysilicon layer ("poly-2") 144, with a layer of silicide 148, a layer of silicon oxynitride 152 are shown after masking and etching to create periphery gate stacks. On the core region 121, on top of the tunnel oxide 112 are layers of polysilicon ("poly-1") 125, oxynitride 128, poly-2 layer 144, silicide layer 148, and a layer of silicon oxynitride 152 thereby forming core gate stacks. The line a to a' is the axis of the drawing shown in cross-section in FIG. 11B. FIG. 11B shows a core gate stack in side view, through the line defined by a and a' of FIG. 11A, with layers of silicon oxynitride 152, silicide 148, poly-2 144, oxynitride 128, poly-1 125, and nitrided tunnel oxide 112 over silicon substrate 104.

IV. Properties of Low Nitrogen Gate Oxide Devices

By manufacturing semiconductor wafers in fashions described above, namely by preventing the introduction of nitrogen atoms into the peripheral regions where gate oxide is to be formed, the semiconductor devices of this invention have improved properties. With conventional methods, the gate oxide layers made after tunnel oxide nitridation exhibit low breakdown voltages, often in the range of from about 2 to 3 volts. The low breakdown voltage can be due to the introduction of nitrogen atoms into the periphery during the manufacturing the tunnel oxide layers in the core. The amount of nitrogen in the gate oxide layer can be determined using secondary ion microscopy, or "SIM." Using SIM, we found that the conventional method can introduce nitrogen atoms in the range of $10^{20}$ to $10^{21}$ nitrogen atoms per cm$^3$ in the core region. In the periphery region, the conventional process carried out without the use of a barrier layer of this invention introduces nitrogen in the range of about $10^{19}$ to $10^{20}$ atoms per cm$^3$. Using a barrier layer of this invention can decrease the number of nitrogen atoms introduced into the periphery to less than about $10^{16}$ to about $10^{18}$ nitrogen atoms per cm$^3$.

One result of this reduction in the number of nitrogen atoms is an increase in the breakdown voltage of the gate oxide region of the semiconductor device. Measurement of the breakdown voltage of a gate oxide region can be made using methods known in the art. We found that conventional manufacturing methods can produce periphery gate oxide regions having breakdown voltages in the range of about 2 to 3 Volts. In contrast, by using the nitride protection method of this invention, the breakdown voltage of isolated gate oxide regions can be increased to the range of from about 10 Volts to about 15 Volts, which represents a substantial improvement in the reliability of the device. Thus, using the barrier layers of this invention, the nitridation improves the tunnel oxide reliability, and the floating gate device can store about 50% of its original charge after as long as 10 years.

The specific embodiments of the invention described herein are intended to be exemplary only. Other embodiments of this invention are possible, and all are considered to be part of this invention.

INDUSTRIAL APPLICABILITY

The methods of this invention are useful in the manufacture of semiconductor devices having improved electrical properties and reduced feature sizes due to the inhibition of contamination of active regions in periphery regions. Semiconductor devices incorporating the improved methods have better performance, longer useful lifetimes, and are less expensive to manufacture.

We claim:

1. A method of manufacturing a gate oxide layer on a semiconductor wafer, the method comprising the steps of:

providing a semiconductor wafer comprising at least a first area of silicon having a first area of sacrificial oxide thereon and a second area of silicon having a second area of sacrificial oxide thereon;

providing a barrier layer over at least said first area of sacrificial oxide;

removing said second area of sacrificial oxide exposing said second area of silicon;

forming a layer of nitridated tunnel oxide on at least said second area of silicon;

removing said barrier layer;

removing said first layer of sacrificial oxide thereby exposing said first area of silicon; and forming a layer of gate oxide on said first area of silicon.

2. The method of claim 1, wherein said barrier layer comprises a nitride layer.

3. The method of claim 2, wherein said nitride is selected from the group consisting of silicon nitride and tungsten nitride.

4. The method of claim 3, wherein said nitride is deposited using plasma enhanced chemical vapor deposition (PECVD).

5. The method of claim 4, wherein said PECVD method comprises using at least one step of using a flow of silane in the range of about 100 sccm to about 500 sccm, using a flow rate of ammonia in the range of about 100 sccm to about 500 sccm, using a plasma power in the range of about 1 Watt/cm$^2$ to about 3 Watts/cm$^2$, and using a total pressure in the deposition chamber in the range of about 1 Torr to about 100 Torr.

6. The method of claim 2, wherein said nitride layer has a thickness in the range of about 50 Å to about 400 Å.

7. The method of claim 1, wherein said barrier layer comprises a polysilicon layer.

8. The method of claim 7, wherein said polysilicon layer is deposited using a PECVD method comprising at least one step of using a silane flow rate in the range of about 100 sccm to about 500 sccm, using a RF power in the range of about 1 Watt/cm$^2$ to about 3 Watts/cm$^2$, and using a total pressure in the deposition chamber in the range of about 1 Torr to about 100 Torr.

9. The method of claim 7, wherein said polysilicon layer has a thickness in the range of about 500 Å to about 1200 Å.

10. The method of claim 1, wherein said barrier layer comprises an oxynitride layer.

11. The method of claim 10, wherein said oxynitride layer is deposited using a PECVD method comprising at least one step of using a silane flow rate in the range of about 100 sccm to about 500 sccm, using a flow rate of ammonia in the range of about 100 sccm to about 500 sccm, using a flow rate of at least one of $N_2O$ and NO in the range of about 40 sccm to about 150 sccm, using a RF power in the range of about 1 Watt/cm$^2$ to about 3 Watts/cm$^2$, and using a total pressure in the deposition chamber in the range of about 1 Torr to about 100 Torr.

12. The method of claim 10, wherein said oxynitride layer has a thickness in the range of about 400 Å to about 500 Å.

13. The method of claim 1, wherein said step of forming a layer of gate oxide is carried out so that the amount of nitrogen in said gate oxide is less than about $10^{16}$ to about $10^{18}$ atoms/cm$^3$.

14. The method of claim 1, further comprising the step of exposing said barrier layer to a plasma made from an etchant gas mixture comprising a halogen, oxygen, and an acid halide.

15. The method of claim 14, wherein said plasma is produced in a PECVD apparatus using radiofrequency (RF) energy source to generate said plasma.

16. The method of claim 14, wherein said RF power is in the range of about 1 Watt/cm$^2$ and about 3 Watts/cm$^2$.

17. The method of claim 14, wherein the halogen is selected from the group consisting of $Cl_2$, $Br_2$ and $I_2$.

18. The method of claim 14, wherein said acid halide is selected from the group consisting of HCl, HBr, and HI.

19. The method of claim 14, wherein the flow rate of said etchant gas mixture is in the range of about 30 standard cubic centimeters per minute (sccm) and about 250 sccm.

20. The method of claim 14, wherein the ratio of halogen to oxygen is in the range of about 3:1 to about 12:1.

21. The method of claim 14, wherein the ratio of acid halide to oxygen is in the range of about 5:1 to about 20:1.

22. The method of claim 14, wherein the etching rate of a layer of nitride is in the range of about 100 Å/min to about 600 Å/min.

23. The method of claim 14, wherein the selectivity of nitride etching to oxide etching is in the range of about 5 to about 15.

24. A method of manufacturing a memory device, the method comprising the steps of:

providing a semiconductor wafer comprising at least a first area of silicon having a first area of sacrificial oxide thereon and a second area of silicon having a second area of sacrificial oxide thereon;

providing a barrier layer over at least said first area of sacrificial oxide;

removing said second area of sacrificial oxide exposing said second area of silicon;

forming a layer of nitridated tunnel oxide on at least said second area of silicon;

removing said barrier layer;

removing said first layer of sacrificial oxide thereby exposing said first area of silicon;

forming a layer of gate oxide on said first area of silicon;

forming an active semiconductor device comprising said layer of nitridated tunnel oxide; and forming an active semiconductor device comprising said layer of gate oxide.

* * * * *